(12) United States Patent
Song et al.

(10) Patent No.: US 8,132,128 B2
(45) Date of Patent: Mar. 6, 2012

(54) METHOD AND SYSTEM FOR PERFORMING LITHOGRAPHY VERIFICATION FOR A DOUBLE-PATTERNING PROCESS

(75) Inventors: Hua Song, San Jose, CA (US); Lantian Wang, Fremont, CA (US); Gerard Terrence Luk-Pat, Sunnyvale, CA (US); James P. Shiely, Aloha, OR (US)

(73) Assignee: Synopsys, Inc., Mountain View, CA (US)

( * ) Notice: Subject to any disclaimer, the term of this patent is extended or adjusted under 35 U.S.C. 154(b) by 651 days.

(21) Appl. No.: 12/263,278

(22) Filed: Oct. 31, 2008

(65) Prior Publication Data

US 2010/0115489 A1    May 6, 2010

(51) Int. Cl.
    G06F 17/50    (2006.01)
    G06F 19/00    (2011.01)
(52) U.S. Cl. .......................................... 716/51; 700/121
(58) Field of Classification Search .............. 716/50–55; 382/144–145; 700/121
    See application file for complete search history.

(56) References Cited

U.S. PATENT DOCUMENTS

| 7,131,100 | B2 | 10/2006 | Lin |
| 2006/0010417 | A1* | 1/2006 | Eurlings et al. ................. 716/21 |
| 2007/0082281 | A1 | 4/2007 | Melvin, III |
| 2007/0220476 | A1* | 9/2007 | Mukherjee et al. ............. 716/18 |
| 2008/0148216 | A1* | 6/2008 | Chan et al. ...................... 716/19 |
| 2009/0061362 | A1* | 3/2009 | Taoka et al. ................... 430/319 |
| 2009/0125868 | A1* | 5/2009 | Mukherjee et al. ............. 716/19 |

\* cited by examiner

*Primary Examiner* — Stacy Whitmore
(74) *Attorney, Agent, or Firm* — Park, Vaughan, Fleming & Dowler LLP

(57) ABSTRACT

One embodiment of the present invention provides a system that performs lithography verification for a double-patterning process on a mask layout without performing a full contour simulation of the mask layout. During operation, the system starts by receiving a first mask which is used in a first lithography step of the double-patterning process, and a second mask which is used in a second lithography step of the double-patterning process. Note that the first mask and the second mask are obtained by partitioning the mask layout. Next, the system receives an evaluation point on the mask layout. The system then determines whether the evaluation point is exclusively located on a polygon of the first mask, exclusively located on a polygon of the second mask, or located elsewhere. The system next computes a printing indicator at the evaluation point for the mask layout based on whether the evaluation point is exclusively located on a polygon of the first mask or exclusively located on a polygon of the second mask.

24 Claims, 6 Drawing Sheets

METHOD AND SYSTEM FOR PERFORMING LITHOGRAPHY VERIFICATION FOR A DOUBLE-PATTERNING PROCESS

BACKGROUND

1. Field of the Invention

The present invention generally relates to techniques for designing and manufacturing integrated circuits (ICs). More specifically, the present invention relates to techniques and systems for performing lithography verification for a double-patterning process.

2. Related Art

Advances in IC manufacturing technology have enabled minimum feature sizes on IC chips to decrease. In fact, the current minimum feature size is significantly smaller than the wavelengths of light used in conventional optical imaging systems. The need for 32-nm node technology has arrived before accompanying high refractive index materials or extreme-ultraviolet (EUV) light source has become available for producing such small nodes. While 193-nm water immersion lithography has been considered a promising technology to push beyond the 32-nm node, this lithography technique generally requires patterning features at an effective dielectric constant ($k_1$) below the theoretical limit of 0.25. However, crossing this physical limit may not be possible unless the minimum pitch requirement is relaxed through splitting the design mask layout into two masks, and printing the mask using a sequence of two separate exposures—which is often referred to as a double-patterning technique (DPT).

Although DPT makes 32-nm and even smaller half-pitch designs feasible, this technique poses new challenges to the lithography verification process, which is often referred to as "lithography rule checking" (LRC). Typically, two approaches are used to perform a conventional single-patterning LRC, which are illustrated in FIG. 2. The first approach is referred to as a "contour-based" LRC, which is illustrated in the top plot of FIG. 2. This approach first simulates contours for the full design layout (e.g., contour 202 of polygon 204), and then performs pinching, bridging, and other types of lithography checking on the simulated contours (e.g., a pinching checking 206 along the narrowest direction on contour 202).

The second LRC approach is referred to as a "check-figure" based LRC. Typically, a check-figure based LRC "pre-filters" a layout to identify both "safe" areas within a layout and "risky" areas within the layout. Subsequently, the safe areas are assigned with sparse intensity evaluation points because these areas are less likely to have problem, and the risky areas with dense intensity evaluation points because these are areas where errors are likely to occur. For example, FIG. 2 illustrates two types of check-figure based pinching LRC verification. Specifically, the middle plot in FIG. 2 illustrates a "gauge-based" LRC, which evaluates intensity at multiple sampling locations along a set of gauge lines 208. Note that gauge lines 208 are concentrated around the risky area (i.e., the pinch) of polygon 204. On the other hand, the bottom plot in FIG. 2 illustrates a "center-line" based pinching check, wherein the intensity evaluations are performed along a single gauge at the lowest point (assuming dark field mask is used) of the intensity profile along a center line 210 (i.e., the long dashed line). Note that, contrary to the contour-based LRC approach, the check-figure based LRC typically does not compute the full contours of a layout, and hence, is computationally efficient.

When performing an LRC verification on a double-patterning process, the two masks associated with the two patterning steps have to be verified together to ensure that the printed pattern from each of the masks does not have pinching problems, and also that the combined patterns from both masks do not have bridging problems. Between the two LRC approaches described above, the contour-based verification is presently the preferred choice. This is because the two patterning steps involve two separate masks which are corrected using different lithography models, and because the two patterning steps do not share a common intensity field due to the etch step that occurs in between. For example, in one technique (see George E. Bailey et al., "Double pattern EDA solutions for 32 nm HP and beyond," Proceedings of SPIE, volume 6521, Design for Manufacturability through Design-Process Integration, March 2007), contours of the two masks' patterns are first simulated with their respective models. Next, the contours for the two masks are OR'ed together, and LRC is conducted on the combined contour. Unfortunately, this contour-based LRC technique can be extremely time-consuming because contour simulation requires dense intensity evaluation over the entire mask layout.

Hence, there is a need for efficient techniques and systems for performing lithography verification for a DPT process.

SUMMARY

One embodiment of the present invention provides a system that performs lithography verification for a double-patterning process on a mask layout without performing a full contour simulation of the mask layout. During operation, the system starts by receiving a first mask which is used in a first lithography step of the double-patterning process, and a second mask which is used in a second lithography step of the double-patterning process. Note that the first mask and the second mask are obtained by partitioning the mask layout. Next, the system receives an evaluation point on the mask layout. The system then determines whether the evaluation point is exclusively located on a polygon of the first mask, exclusively located on a polygon of the second mask, or located elsewhere (interactive area). The system next computes a printing indicator at the evaluation point for the mask layout, based on whether the evaluation point is exclusively located on a polygon of the first mask or exclusively located on a polygon of the second mask.

In a variation on this embodiment, if the evaluation point is exclusively located on a polygon of the first mask, the system uses a first lithography model associated with the first lithography step to compute the printing indicator at the evaluation point. If the evaluation point is exclusively located on a polygon of the second mask, the system then uses a second lithography model associated with the second lithography step to compute the printing indicator at the evaluation point. Alternatively, if the evaluation point is neither exclusively located on a polygon of the first mask nor exclusively located on a polygon of the second mask, the system uses both the first lithography model and the second lithography model to compute the printing indicator at the evaluation point.

In a further variation on this embodiment, the system uses the first lithography model to compute the printing indicator at the evaluation point by: (1) computing a first intensity value and a first threshold value at the evaluation point using the first lithography model; and (2) determining a difference between the first intensity value and the first threshold value.

In a further variation, the system uses the second lithography model to compute the printing indicator at the evaluation point by: (1) computing a second intensity value and a second threshold value at the evaluation point using the second lithography model; and (2) determining a difference between the second intensity value and the second threshold value.

In a further variation, the system uses both the first lithography model and the second lithography model to compute the printing indicator by computing a first intensity value and a first threshold value at the evaluation point using the first lithography model; and computing a second intensity value and a second threshold value at the evaluation point using the second lithography model. The system then computes a first difference between the first intensity value and the first threshold value, and a second difference between the second intensity value and the second threshold value. If the first difference is greater than the second difference, the system then sets the printing indicator to be equal to the first difference. Alternatively, if the second difference is greater than the first difference, the system subsequently sets the printing indicator to be equal to the second difference.

In a further variation, if the evaluation point is neither exclusively located on a polygon of the first mask nor exclusively located on a polygon of the second mask, the evaluation point is then located at either an overlapping area between a polygon of the first mask and a polygon of the second mask, or an open space region.

In a variation on this embodiment, the system receives a set of evaluation points on the mask layout, wherein the set of evaluation points are used to sample an area within the mask layout which is likely to contain a lithography hotspot. Next, the system determines the printing indicator at the set of the evaluation points.

In a further variation, the system uses the printing indicator computed for the set of evaluation points to determine a contour for the mask layout which represents pattern shapes which are expected to be printed on a wafer.

In a variation on this embodiment, prior to receiving the evaluation point, the system identifies areas within the mask layout which are less likely to contain lithography hotspots and subsequently selects sparse evaluation points in the identified areas.

In a further variation, the system identifies areas within the mask layout which are likely to contain lithography hotspots and subsequently selects dense evaluation points in the identified areas.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the claims.

The data structures and code described in this detailed description are typically stored on a computer-readable storage medium, which may be any device or medium that can store code and/or data for use by a computer system. This includes, but is not limited to, volatile memory, non-volatile memory, magnetic and optical storage devices such as disk drives, magnetic tape, CDs (compact discs), DVDs (digital versatile discs or digital video discs), or other media capable of storing computer readable media now known or later developed.

Integrated Circuit Design Flow

Figure 1:
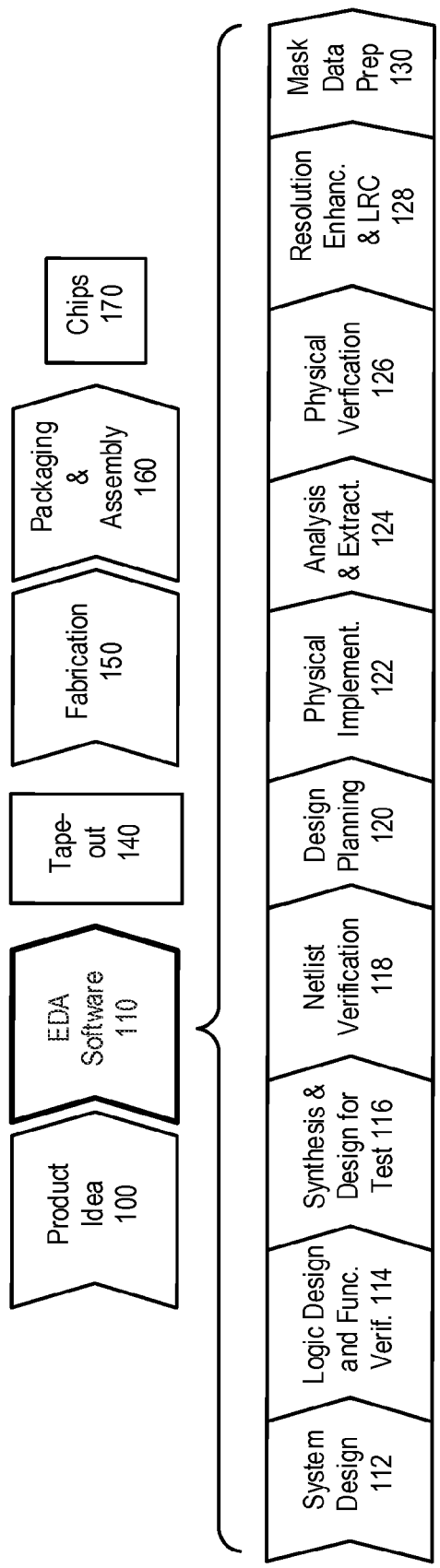
FIG. 1 illustrates various steps in the design and fabrication of an integrated circuit.
Figure 2:
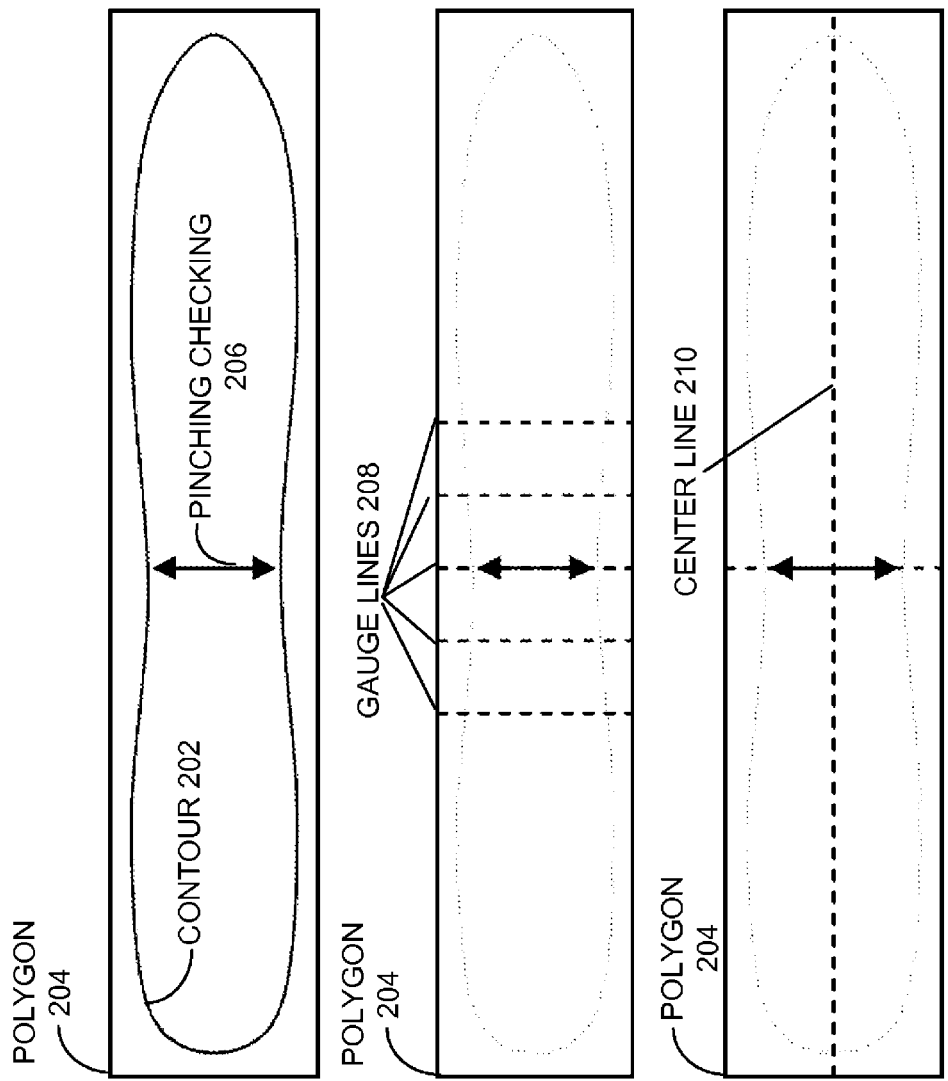
FIG. 2 illustrates both contour-based lithography rule checking (LRC) techniques and check-figure based LRC techniques.

FIG. 1 illustrates various steps in the design and fabrication of an integrated circuit. The process starts with the generation of a product idea (stage 100), which is realized using an Electronic Design Automation (EDA) software design process (stage 110). When the design is finalized, it can be taped-out (stage 140). After tape-out, the fabrication process is consummated (stage 150) and packaging and assembly processes (stage 160) are performed which ultimately result in finished chips (stage 170).

The EDA software design process (stage 110), in turn, comprises stages 112-130, which are described below. Note that this design flow description is for illustration purposes only. This description is not meant to limit the present invention. For example, an actual integrated circuit design may require a designer to perform the design stages in a different sequence than the sequence described herein. The following discussion provides further details of the stages in the design process.

System design (stage 112): The designers describe the functionality to implement. They can also perform what-if planning to refine the functionality and to check costs. Hardware-software architecture partitioning can occur at this stage. Exemplary EDA software products from SYNOPSYS, INC. that can be used at this stage include MODEL ARCHITECT®, SABER®, SYSTEM STUDIO®, and DESIGNWARE® products.

Logic design and functional verification (stage 114): At this stage, the VHDL or Verilog code for modules in the system is written and the design is checked for functional accuracy. More specifically, the design is checked to ensure that it produces the correct outputs. Exemplary EDA software products from SYNOPSYS, INC. that can be used at this stage include VCS®, VERA®, DESIGNWARE®, MAGELLAN®, FORMALITY®, ESP® and LEDA® products.

Synthesis and design for test (stage 116): Here, the VHDL/Verilog is translated to a netlist. The netlist can be optimized for the target technology. Additionally, tests can be designed and implemented to check the finished chips. Exemplary EDA software products from SYNOPSYS, INC. that can be used at this stage include DESIGN COMPILER®, PHYSICAL COMPILER®, TEST COMPILER®, POWER COMPILER®, FPGA COMPILER®, TETRAMAX®, and DESIGNWARE® products.

Netlist verification (stage 118): At this stage, the netlist is checked for compliance with timing constraints and for correspondence with the VHDL/Verilog source code. Exemplary EDA software products from SYNOPSYS, INC. that can be used at this stage include FORMALITY®, PRIMETIME®, and VCS® products.

Design planning (stage 120): Here, an overall floor plan for the chip is constructed and analyzed for timing and top-level routing. Exemplary EDA software products from SYNOPSYS, INC. that can be used at this stage include ASTRO® and IC COMPILER® products.

Physical implementation (stage 122): The placement (positioning of circuit elements) and routing (connection of the same) occurs at this stage. Exemplary EDA software products from SYNOPSYS, INC. that can be used at this stage include the ASTRO® and IC COMPILER® products.

Analysis and extraction (stage 124): At this stage, the circuit function is verified at a transistor level; this, in turn, permits what-if refinement. Exemplary EDA software products from SYNOPSYS, INC. that can be used at this stage include ASTRORAIL®, PRIMERAIL®, PRIMETIME®, and STAR RC/XT® products.

Physical verification (stage 126): In this stage, the design is checked to ensure correctness for manufacturing, electrical issues, lithographic issues, and circuitry. Exemplary EDA software products from SYNOPSYS, INC. that can be used at this stage include the HERCULES® product.

Resolution enhancement and lithography rule checking (LRC) (stage 128): This stage involves geometric manipulations of the layout to improve manufacturability of the design and lithography printability checking. Exemplary EDA software products from SYNOPSYS, INC. that can be used at this stage include PROTEUS®, PROTEUS®AF, and SiVL® products.

Mask data preparation (stage 130): This stage provides the tape-out data for production of masks to produce finished chips. Exemplary EDA software products from SYNOPSYS, INC. that can be used at this stage include the CATS® family of products.

Embodiments of the present invention can be used during one or more of the above-described steps. Specifically, one embodiment of the present invention can be used during the resolution enhancement and lithography rule checking step 128.

Overview

Generally, a DPT process involves decomposing a target mask layout (also referred to as "original mask layout" throughout) into two masks, i.e., mask 1 and mask 2, wherein the mask 1 patterning step is separated from the mask 2 patterning step by an etch step. Because of the difference in the physical processes involved in the two patterning steps, separate lithography models (i.e., model 1 for mask 1, and model 2 for mask 2) are used to simulate intensity fields resulting from the two patterning steps. Note that these two intensity fields for the two masks do not physically exist at the same time. Moreover, within a potential overlapping region resulting from the process of mask decomposition, the two models may generate different intensity values at the same mask locations.

Embodiments of the present invention provide a technique to make the check-figure based LRC verification feasible for a DPT process. More specifically, one embodiment of the present invention provides a unified "intensity model" (or a "combined intensity model") for the target layout by combining the two intensity fields separately computed using model 1 and model 2 for mask 1 and mask 2, respectively. Note that this combined intensity model can accurately predict the contour positions of patterns from both masks, which is hereinafter referred to as "contour preserving" property. While the combined intensity model can determine contour positions of the target layout accurately, it does not require computing full contours or even performing a dense grid simulation for the mask layout. This contour-preserving intensity model requires very few changes to the existing check-figure based LRC verification, but can achieve significant speedup against the contour-based LRC technique for the DPT processes.

Determining a Combined Intensity Model

Typically, a model-based lithography simulation tool operates in the following manner. Given a mask layout (i.e., a "layout"), a lithography model (i.e., a "model"), and an evaluation point $p(x, y)$ in the mask layout, a simulation API function call returns both the intensity and the threshold (which can be either a constant threshold or a variable threshold calculated at that point):

$$(\text{intensity, threshold}) = \text{simulation\_api}(\text{model, layout}, x, y). \quad (1)$$

Next, the computed intensity and threshold can be used to detect lithography errors, or to simply determine the contours for the patterned layout.

To extend the above lithography simulation tool to the DPT process, we assume that the original mask layout has been decomposed into two masks, mask 1 and mask 2, which are associated with the corresponding lithography models, model 1 and model 2, respectively. As mentioned above, these two models describe the two separate patterning steps in the DPT process.

Figure 3A:
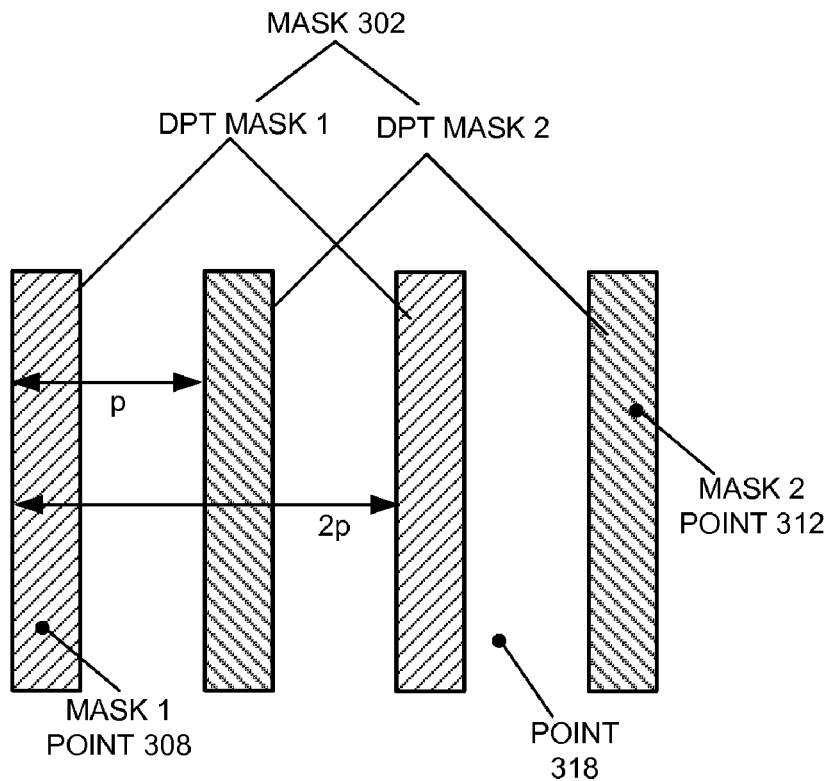
FIG. 3A illustrates decomposing a target layout into the corresponding DPT mask 1 and DPT mask 2 with a result of pitch doubling in accordance with an embodiment of the present invention.
Figure 3B:
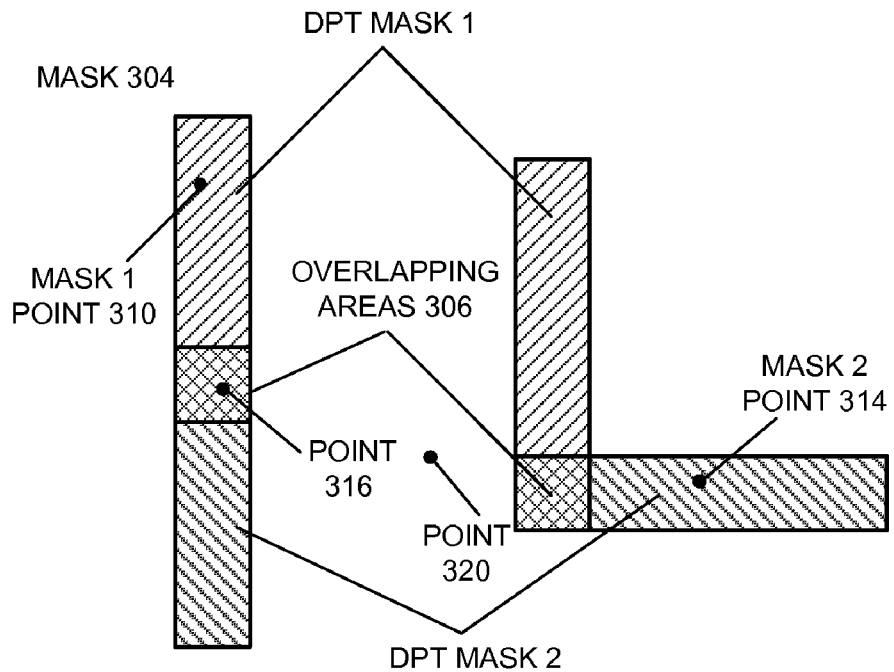
FIG. 3B illustrates decomposing a target layout into the corresponding DPT mask 1 and DPT mask 2 which have overlapping areas in accordance with an embodiment of the present invention.

FIG. 3 illustrates a process of decomposing a target mask layout into two DPT masks in accordance with an embodiment of the present invention. More specifically, FIG. 3A illustrates decomposing a target layout 302 into the corresponding DPT mask 1 and DPT mask 2 with a result of pitch doubling. Note that the DPT decomposition process in FIG. 3A effectively doubles the pitch from p in mask 302 to 2p in both DPT mask 1 and DPT mask 2. Also note that there is no overlapping between the two DPT masks. Separately, FIG. 3B illustrates decomposing a target layout 304 into the corresponding DPT mask 1 and DPT mask 2 which have overlapping areas. Note that the DPT decomposition process in FIG. 3B creates two overlapping areas 306 (the cross-hatched areas) between DPT mask 1 and DPT mask 2.

In one embodiment of the present invention, after the original mask layout has been decomposed into the two DPT masks, each point in the original mask layout can be classified into three categories. Category 1—exclusively on mask 1 (such as point 308 in FIG. 3A or point 310 in FIG. 3B): a category 1 point is on a polygon of mask 1 but not on any polygon of mask 2; category 2—exclusively on mask 2 (such as point 312 in FIG. 3A or point 314 in FIG. 3B): a category 2 point is on a polygon of mask 2 but not on any polygon of mask 1; category 3—the rest (or in an interactive area). Note that based on this classification, category 3 includes both points within overlapping areas between mask 1 and mask 2 (such as point 316 in FIG. 3B), and points in the space between mask 1 and mask 2 (such as point 318 in FIG. 3A or point 320 in FIG. 3B).

In some embodiments, a point in a space region can be classified into exclusively mask 1 point (i.e., non-interactive), or exclusively mask 2 point (non-interactive). However, most space regions are considered as interactive regions due to the nature of pitch-doubling though layout decomposition.

Recall that a check-figure based LRC computes intensity values at a set of pre-filtered evaluation points within a mask layout. When performing lithography verification for a DPT process, complexity arises because each of the evaluation points may be affected by the first patterning step only, by the second patterning step only, or by both patterning steps. The present invention provides a combined intensity and threshold model which is capable of accurately determining the contour position after the two patterning steps.

Specifically, given an evaluation point p(x, y), the system first determines which of the above-described three categories the evaluation point belongs to. Note that this determination is straightforward if p(x, y) belongs to one of the first two categories (e.g., through a geometric operation). Moreover, to determine if the evaluation point belongs to the third category, the system can simply determine that p(x, y) does not belong to either of the first two categories.

After classifying p(x, y) into one of the three categories, the system then computes a printing indicator at the evaluation point for the original mask layout based on the determined relationship of the evaluation point with mask 1 and mask 2.

Specifically, if p(x, y) belongs to category 1, (i.e., if the point is exclusively located on a polygon of mask 1), the system then uses lithography model 1 associated with the first DPT patterning step to compute the printing indicator Ic(x, y) at the evaluation point p(x, y). More specifically, let $I_1(x, y)$ be the intensity computed at p(x, y) using model 1, and $T_1(x, y)$ be the threshold computed using model 1. The system then computes the printing indicator by using Ic(x, y)=$I_1$(x, y)–$T_1$(x, y). In one embodiment, $T_1$(x, y) is a constant threshold value $T_1$ for all p(x, y) belongs to category 1.

If p(x, y) belongs to category 2, (i.e., if the point is exclusively located on a polygon of mask 2), the system then uses lithography model 2 associated with the second DPT patterning step to compute the printing indicator Ic(x, y) at the evaluation point p(x, y). More specifically, let $I_2$(x, y) be the intensity computed at p(x, y) using model 2, and $T_2$(x, y) be the threshold computed using model 2. The system then computes the printing indicator by using Ic(x, y)=$I_2$(x, y)–$T_2$(x, y). In one embodiment, $T_2$(x, y) is a constant threshold $T_2$ for all p(x, y) belongs to category 2.

Alternatively, if p(x, y) belongs to category 3, (i.e., if it is neither exclusively located on mask 1 nor exclusively located on mask 2), the system then computes the printing indicator by using the greater of the two printing indicators $I_1$(x, y)–$T_1$(x, y) and $I_2$(x, y)–$T_2$(x, y). Note that this case can be applied to an evaluation point in an overlapping area between mask 1 and mask 2, or in a space region that is neither on a mask 1 polygon or a mask 2 polygon. Essentially, the printing indicator for a category 3 point is determined based on one of the two lithography models that gives a greater contribution.

Hence, the system defines a combined printing indicator Ic(x, y) at an arbitrary evaluation point p(x, y) based on the following combined intensity model:

$$Ic(x, y) = I_1(x, y) - T_1(x, y); \text{ if } p(x, y) \text{ is exclusively on mask 1} \quad (2)$$
$$= I_2(x, y) - T_2(x, y); \text{ if } p(x, y) \text{ is exclusively on mask 2}$$
$$= \text{MAX}(I_1(x, y) - T_1(x, y), I_2(x, y) - T_2(x, y));$$
$$\text{if otherwise.}$$

Note that the above choice of using the greater of the two values at a category 3 point is based on the assumption that dark field masks are used in the DPT process. If bright field masks are used instead, the above formulation may be modified accordingly. However, it remains true that at each evaluation point, the printing indicator is determined based on one of the two lithography models that gives a greater contribution.

Furthermore, the formulation for the combined intensity model Ic can be considered to have a constant threshold Tc=0. Consequently, the combined intensity model Ic, which has a common threshold Tc=0, combines the original two intensity fields of the DPT process (which do not physically exist at the same time) into a single intensity profile for the original mask layout.

Note that it is not obvious to combine the two intensity fields for the two masks to create the combined intensity field for the target mask layout. This is because the two intensity fields have different thresholds, hence the two intensity fields are not directly comparable or combinable. In order to create the combined intensity model, embodiments of the present invention first make the two intensity fields comparable by subtracting the different thresholds from the corresponding intensity fields, thereby making the two modified intensity fields (which have the common threshold Tc=0) comparable and combinable.

In an alternative representation for the combined intensity model, the combined intensity Ic is separated from a combined threshold Tc. More specifically, Ic and Tc are defined as:

$$Ic(x, y) =$$

$I_1(x, y)$; if p(x, y) is exclusively on mask 1

$I_2(x, y)$; if p(x, y) is exclusively on mask 2

$I_1(x, y)$; if p(x, y) is in an interactive area and $I_1$(x, y)–$T_1$(x, y)≧$I_2$(x, y)–$T_2$(x, y));

$I_2(x, y)$; if p(x, y) is in an interactive area and $I_2$(x, y)–$T_2$(x, y)>$I_2$(x, y)–$T_2$(x, y));

and $$Tc(x, y) =$$

$T_1(x, y)$; if p(x, y) is exclusively on mask 1

$T_2(x, y)$; if p(x, y) is exclusively on mask 2

$T_1(x, y)$; if p(x, y) is in an interactive area and $I_1$(x, y)–$T_1$(x, y)≧$I_2$(x, y)–$T_2$(x, y));

$T_2(x, y)$; if p(x, y) is in an interactive area and $I_2$(x, y)–$T_2$(x, y)>$I_2$(x, y)–$T_2$(x, y)). (3)

Although formulation (3) maintains a variable threshold, the two formulations (2) and (3) are essentially equivalent.

This combined intensity model is constructed over the original two models of the two patterning steps. In practice, this model can be implemented in either downstream tools that require model-based simulation, such as Synopsys's SiVL and IC Workbench, or model-building tools such as Synopsys's ProGen. In particular, the combined intensity model may be integrated into the model-based simulation tool represented by formulation (1). Specifically, formulation (1) can be modified as:

(intensity, threshold)=simulation_api(model, layout, x, y, location), wherein "location" is a parameter that indicates whether the evaluation point p(x, y) is located: exclusively on mask 1, exclusively on mask 2, or in an interactive area. In one embodiment, this parameter can be readily determined by a geometric operation, and "intensity" and "threshold" return values for Ic and Tc.

Figure 4:
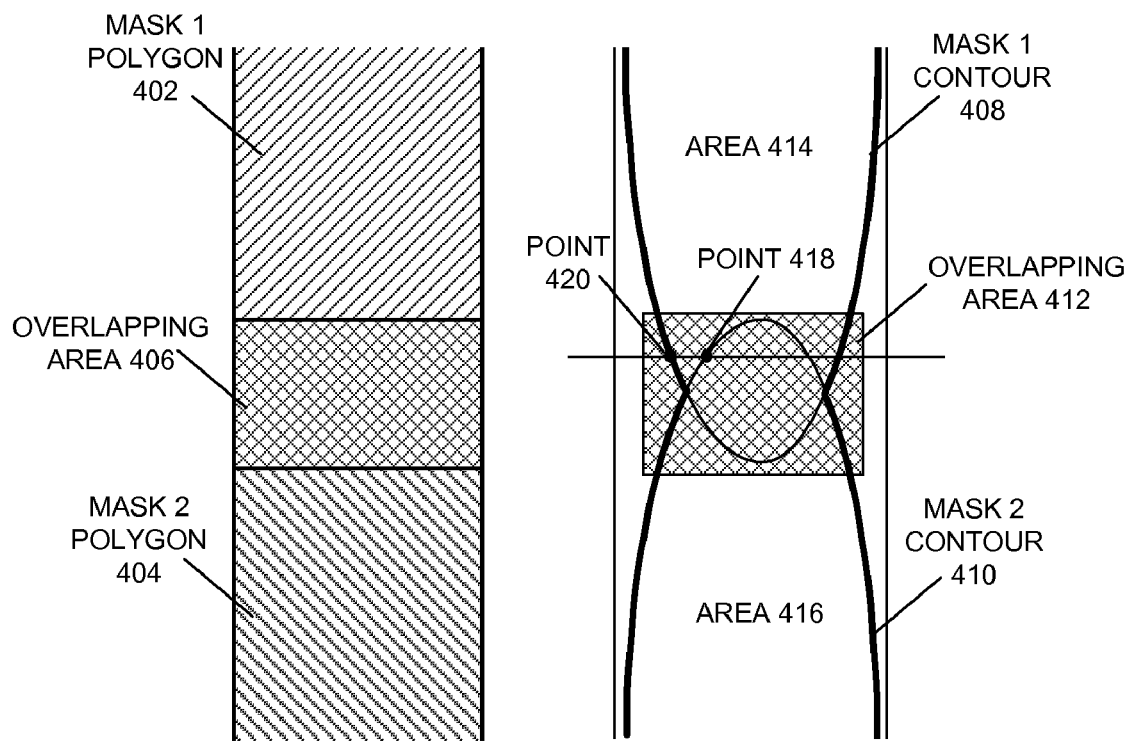
FIG. 4 illustrates an exemplary DPT process which is used to describe the contour-preserving property of the combined intensity model in accordance with an embodiment of the present invention.

Recall that the prior art technique separately computes the contours for mask 1 and mask 2, and subsequently obtains the contour for the original mask layout by OR'ing the two contours. The combined intensity model of formulation (2) can accurately predict the contour positions (i.e., contour-preserving) for the original mask layout without having to compute the contours for either of the two masks. FIG. 4 illustrates an exemplary DPT process which is used to describe the contour-preserving property of the combined intensity model in accordance with an embodiment of the present invention.

Specifically, the left-hand side of FIG. 4 illustrates a portion of a decomposed DPT layout, which comprises a polygon 402 of mask 1 and a polygon 404 of mask 2, and an overlapping area 406 between polygon 402 and 404 (the cross-hatched area). The right-hand side of FIG. 4 illustrates a simulated contour 408 which corresponds to polygon 402 of mask 1, and a contour 410 which corresponds to polygon 404 of mask 2. Contour 408 and contour 410 overlap in an area 412, which corresponds to overlapping area 406 of the original mask layout. Note that in the non-overlapping areas 414 and 416, the contour associated with the combined intensity model is simply contour 408 and 410, respectively.

To determine the contour position in overlapping area 412, consider an evaluation point 418 on mask 2 contour 410. Based on formulation (2), at point 418, $I_2-T_2=0$ because it is on contour 410 of mask 2, while $I_1-T_1>0$ because point 418 is inside contour 408 of mask 1. Because the mask 1 pattern has a greater contribution at point 418, $I_1-T_1$ is used for the combined model instead of $I_2-T_2$. In the same manner, it can be observed that that portion of contour 408 which is inside contour 410 (i.e., the lightweight portion of contour 408), and the portion of contour 410 which is inside contour 408 (i.e., the lightweight portion of contour 410) are excluded from the combined model.

Next, consider point 420 on contour 408. Based on formulation (2), at point 420, $I_1-T_1=0$ because it is on the contour of mask 1, while $I_2-T_2<0$ because point 420 is outside the contour of mask 2. Hence, at point 420, $I_1-T_1$ is used for the combined model (i.e., contour 408 itself) instead of $I_2-T_2$. In the same manner, it can be observed that the contour for the combined intensity model within overlapping area 412 is determined by the heavyweight portions of contours 408 and 410 which define the outer boundary of the overlapping contours. Consequently, the contour profile for the combined intensity model is depicted as the heavyweight outlines. Note that we derived this contour profile based on formulation (2), wherein the result is consistent with the contour obtained by OR'ing contours 408 and 410. Hence, the combined intensity model preserves the contour positions.

In one embodiment of the present invention, the concept of a combined intensity model can be extended to lithography process models associated with a process window. Specifically, a process parameter typically includes a nominal value associated with ideal processing conditions, and one or more values associated with process variations. For example, the lithography process is typically associated with an in-focus nominal condition and defocus conditions, and these defocus conditions can often cause the contour profile variations. Generally, formulation (2) can be modified to accommodate the worst-case scenarios.

For example, to detect a pinching problem in a printed line feature, the narrowest location on the contour is mostly likely to have the pinching problem. For example, for three given defocus values defoc_0, defoc_n, and defoc_p, formulation (2) is modified as follows:

Denote $$F_1(x, y) = \text{MIN}(I_{1\_defoc\_0}(x, y) - T_{1\_defoc\_0}(x, y), I_{1\_defoc\_n}(x, y) - T_{1\_defoc\_n}(x, y), I_{1\_defoc\_p}(x, y) - T_{1\_defoc\_p}(x, y))$$

$$F_2(x, y) = \text{MIN}(I_{2\_defoc\_0}(x, y) - T_{2\_defoc\_0}(x, y), I_{2\_defoc\_n}(x, y) - T_{2\_defoc\_n}(x, y), I_{2\_defoc\_p}(x, y) - T_{2\_defoc\_p}(x, y)),$$

The combined intensity model is defined as:

$$Ic(x, y) = F_1(x, y); \text{ if } (x, y) \text{ is exclusively on mask 1};$$
$$= F_2(x, y); \text{ if } (x, y) \text{ is exclusively on mask 2};$$
$$= \text{MAX}(F_1(x, y), F_2(x, y)); \text{ if otherwise.}$$

Note that the above formulation again assumes that dark field mask is used. This formulation can be easily modified for fewer than or greater than three defocus values, as well as for multiple exposure dose values. Moreover, for bridging-error checking, the above formulation is modified by changing "MIN" to "MAX" and "MAX" to "MIN."

Figure 5:
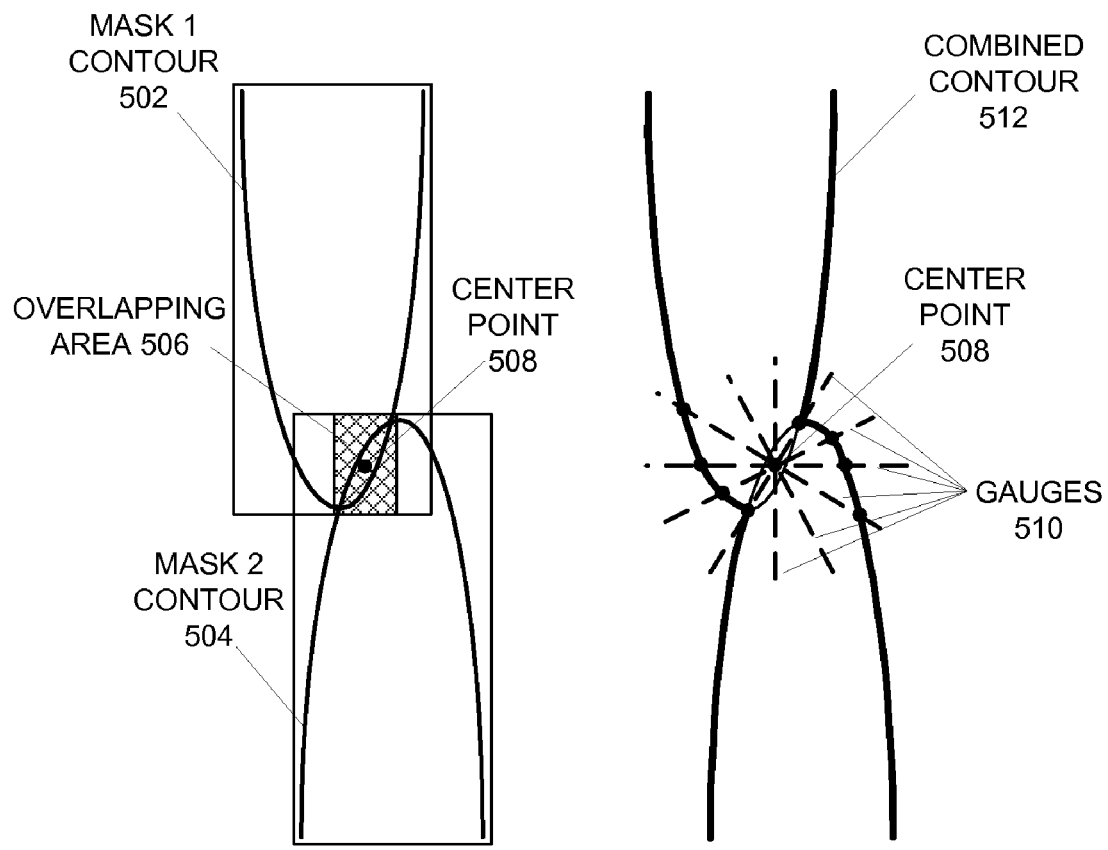
FIG. 5 illustrates an exemplary process of performing a check-figure based lithography verification using the combined intensity model in accordance with an embodiment of the present invention.

FIG. 5 illustrates an exemplary process of performing a check-figure based lithography verification using the combined intensity model in accordance with an embodiment of the present invention.

As illustrated on the left-hand side of FIG. 5, overlapping contours 502 and 504 are associated with a mask 1 polygon and a mask 2 polygon, respectively. Note that because the two contours are slightly offset in the horizontal direction, the overlapping area 506 (the cross-hatched area) between the two contours is narrower than the overlapping area 412 illustrated in FIG. 4. To ensure no pinching occurs around overlapping area 506, a check-figure based lithography verification may be performed. Note that a check-figure based verification does not check the entire mask. As mentioned previously, check-figure based verification typically uses a pre-filtering process to select locations which are likely to have problems. In the case of FIG. 5, a pre-filtering process can locate overlapping area 506, and subsequently determine the center point 508 of overlapping area 506. The right-hand side of FIG. 5 illustrates an embodiment of performing a check-figure based verification around overlapping area 506.

Specifically, a set of gauges 510 passing through center point 508 are drawn at different angles. Next, a number of evaluation points can be placed along each of the gauges 510, and the combined intensity model can be applied to evaluate the printing indicator at each of the evaluation points. Note that for each of the gauges 510, a pair of contour points can be located (shown on the combined contour profile 512). Based on these computed contour points, the narrowest part of contour profile 512 (i.e., the critical dimension (CD)) can be determined, which is subsequently used to determine if there is a pinching problem. However, the actual contour 512 of the layout, though shown for illustration purposes, is not computed during the verification process.

Figure 6:
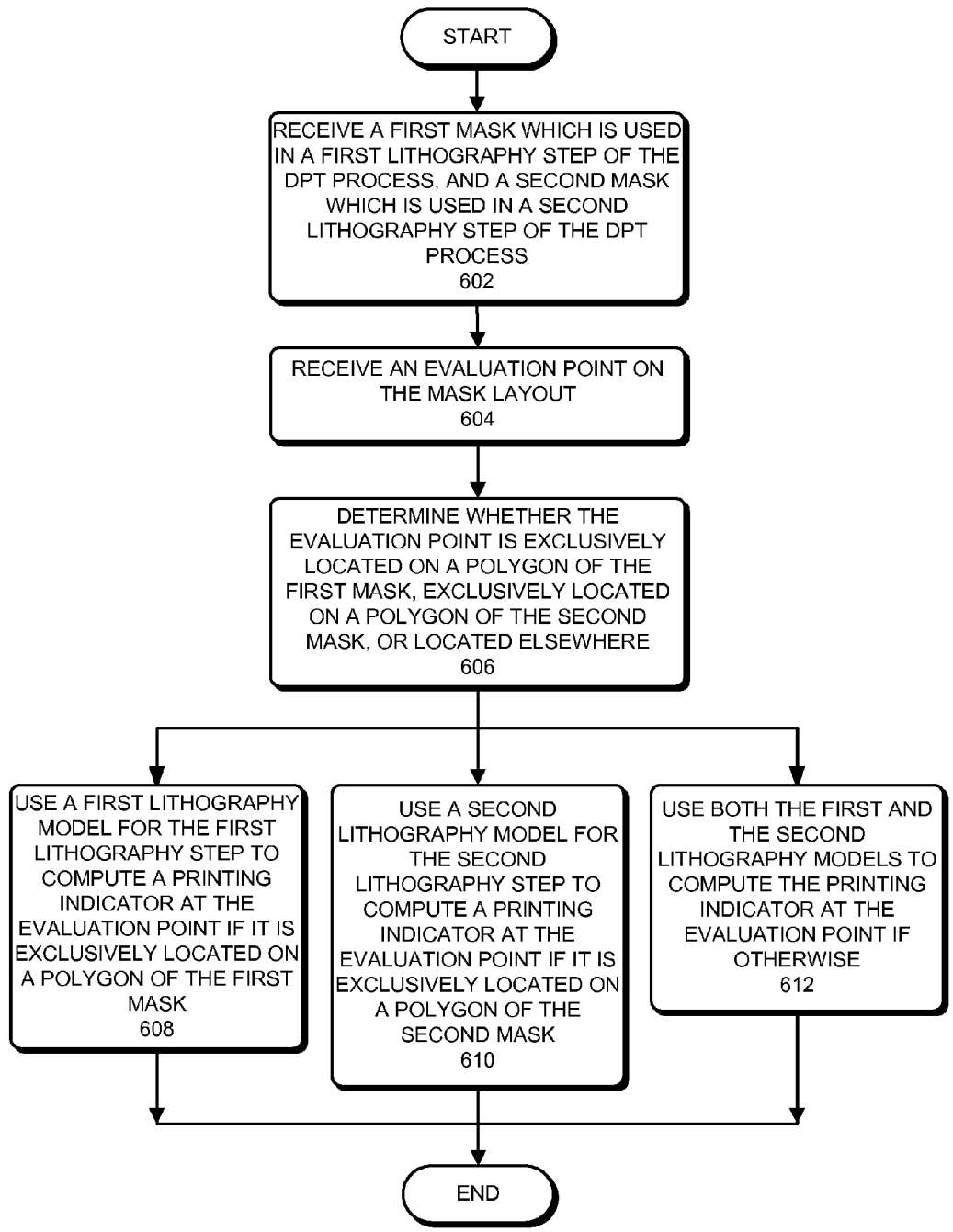
FIG. 6 presents a flowchart illustrating a process of performing lithography verification on a DPT process on a target mask layout without performing a full contour simulation of the mask layout in accordance with an embodiment of the present invention.

FIG. 6 presents a flowchart illustrating a process of performing lithography verification on a DPT process on a target mask layout without performing a full contour simulation of the mask layout in accordance with an embodiment of the present invention.

During operation, the system receives a first mask which is used in a first lithography step of the DPT process, and a second mask which is used in a second lithography step of the DPT process (step 602). Note that the first mask and the second mask are obtained by partitioning the target mask layout. The system then receives an evaluation point on the mask layout (step 604).

In some embodiments, prior to receiving the evaluation point, the system pre-filters the target mask layout to establish a set of evaluation points on the layout. Specifically, areas within the layout that are less likely to have lithography errors or hotspots are assigned with sparse or no evaluation points, whereas areas within the layout where lithography errors are more likely to occur (e.g., potential hotspots) are assigned with dense evaluation points.

Next, the system determines whether the evaluation point is exclusively located on a polygon of the first mask, exclusively located on a polygon of the second mask, or located elsewhere (step 606).

If the system determines that the evaluation point is exclusively located on a polygon of the first mask, the system then uses a first lithography model associated with the first lithography step to compute a printing indicator at the evaluation point (step 608). If the system determines that the evaluation point is exclusively located on a polygon of the second mask, the system then uses a second lithography model associated with the second lithography step to compute the printing indicator at the evaluation point (step 610).

If the system determines that the evaluation point is neither exclusively located on a polygon of the first mask nor exclusively located on a polygon of the second mask, the system subsequently uses both the first lithography model and the second lithography model to compute the printing indicator at the evaluation point (step 612). More specifically, the system uses one of the two lithography models which gives a higher contribution at the evaluation point to compute the printing indicator at the evaluation point.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for performing lithography verification for a double-patterning process on a mask layout without performing a full contour simulation of the mask layout, the method comprising:
    receiving a first mask which is used in a first lithography step of the double-patterning process, and a second mask which is used in a second lithography step of the double-patterning process, wherein the first mask and the second mask are obtained by partitioning the mask layout;
    receiving an evaluation point on the mask layout;
    determining whether the evaluation point is exclusively located on a polygon of the first mask, exclusively located on a polygon of the second mask, or located elsewhere; and
    computing, by computer, a printing indicator at the evaluation point for the mask layout based on whether the evaluation point is exclusively located on a polygon of the first mask, exclusively located on a polygon of the second mask, or located elsewhere.

2. The method of claim 1, wherein computing the printing indicator at the evaluation point for the mask layout involves:
    if the evaluation point is exclusively located on a polygon of the first mask, using a first lithography model associated with the first lithography step to compute the printing indicator at the evaluation point;
    if the evaluation point is exclusively located on a polygon of the second mask, using a second lithography model associated with the second lithography step to compute the printing indicator at the evaluation point; and
    if the evaluation point is neither exclusively located on a polygon of the first mask, nor exclusively located on a polygon of the second mask, using both the first lithography model and the second lithography model to compute the printing indicator at the evaluation point.

3. The method of claim 2, wherein using the first lithography model to compute the printing indicator at the evaluation point involves:
    computing a first intensity value and a first threshold value at the evaluation point using the first lithography model; and
    computing the printing indicator by determining a difference between the first intensity value and the first threshold value.

4. The method of claim 2, wherein using the second lithography model to compute the printing indicator at the evaluation point involves:
    computing a second intensity value and a second threshold value at the evaluation point using the second lithography model; and
    computing the printing indicator by determining a difference between the second intensity value and the second threshold value.

5. The method of claim 2, wherein using both the first lithography model and the second lithography model to compute the printing indicator involves:
    computing a first intensity value and a first threshold value at the evaluation point using the first lithography model;
    computing a second intensity value and a second threshold value at the evaluation point using the second lithography model;
    computing a first difference between the first intensity value and the first threshold value;
    computing a second difference between the second intensity value and the second threshold value;
    if the first difference is greater than the second difference, setting the printing indicator to be equal to the first difference; and
    if the second difference is greater than the first difference, setting the printing indicator to be equal to the second difference.

6. The method of claim 2, wherein if the evaluation point is neither exclusively located on a polygon of the first mask, nor exclusively located on a polygon of the second mask, the evaluation point is located at either:
    an overlapping area between a polygon of the first mask and a polygon of the second mask; or
    an open space region.

7. The method of claim 1, wherein the method further comprises:
    receiving a set of evaluation points on the mask layout, wherein the set of evaluation points are used to sample an area within the mask layout which is likely to contain a lithography hotspot; and determining the printing indicator at the set of the evaluation points.

8. The method of claim 7, wherein the method further comprises using the printing indicator computed for the set of evaluation points to determine a contour for the mask layout which represents pattern shapes which are expected to be printed on a wafer.

9. The method of claim 1, wherein prior to receiving the evaluation point, the method further comprises:
identifying areas within the mask layout which are less likely to contain lithography hotspots; and
selecting sparse evaluation points in the identified areas.

10. The method of claim 9, wherein the method further comprises:
identifying areas within the mask layout which are likely to contain lithography hotspots; and
selecting dense evaluation points in the identified areas.

11. A non-transitory computer-readable storage medium storing instructions that when executed by a computer cause the computer to perform a method for performing lithography verification for a double-patterning process on a mask layout without performing a full contour simulation of the mask layout, the method comprising:
receiving a first mask which is used in a first lithography step of the double-patterning process, and a second mask which is used in a second lithography step of the double-patterning process, wherein the first mask and the second mask are obtained by partitioning the mask layout;
receiving an evaluation point on the mask layout;
determining whether the evaluation point is exclusively located on a polygon of the first mask, exclusively located on a polygon of the second mask, or located elsewhere; and
computing a printing indicator at the evaluation point for the mask layout based on whether the evaluation point is exclusively located on a polygon of the first mask or exclusively located on a polygon of the second mask.

12. The non-transitory computer-readable storage medium of claim 11, wherein computing the printing indicator at the evaluation point for the mask layout involves:
if the evaluation point is exclusively located on a polygon of the first mask, using a first lithography model associated with the first lithography step to compute the printing indicator at the evaluation point;
if the evaluation point is exclusively located on a polygon of the second mask, using a second lithography model associated with the second lithography step to compute the printing indicator at the evaluation point; and
if the evaluation point is neither exclusively located on a polygon of the first mask, nor exclusively located on a polygon of the second mask, using both the first lithography model and the second lithography model to compute the printing indicator at the evaluation point.

13. The non-transitory computer-readable storage medium of claim 12, wherein using the first lithography model to compute the printing indicator at the evaluation point involves:
computing a first intensity value and a first threshold value at the evaluation point using the first lithography model; and
computing the printing indicator by determining a difference between the first intensity value and the first threshold value.

14. The non-transitory computer-readable storage medium of claim 12, wherein using the second lithography model to compute the printing indicator at the evaluation point involves:
computing a second intensity value and a second threshold value at the evaluation point using the second lithography model; and
computing the printing indicator by determining a difference between the second intensity value and the second threshold value.

15. The non-transitory computer-readable storage medium of claim 12, wherein using both the first lithography model and the second lithography model to compute the printing indicator involves:
computing a first intensity value and a first threshold value at the evaluation point using the first lithography model;
computing a second intensity value and a second threshold value at the evaluation point using the second lithography model;
computing a first difference between the first intensity value and the first threshold value;
computing a second difference between the second intensity value and the second threshold value;
if the first difference is greater than the second difference, setting the printing indicator to be equal to the first difference; and
if the second difference is greater than the first difference, setting the printing indicator to be equal to the second difference.

16. The non-transitory computer-readable storage medium of claim 12, wherein if the evaluation point is neither exclusively located on a polygon of the first mask, nor exclusively located on a polygon of the second mask, the evaluation point is located at either:
an overlapping area between a polygon of the first mask and a polygon of the second mask; or
an open space region.

17. The non-transitory computer-readable storage medium of claim 11, wherein the method further comprises:
receiving a set of evaluation points on the mask layout, wherein the set of evaluation points are used to sample an area within the mask layout which is likely to contain a lithography hotspot; and
determining the printing indicator at the set of the evaluation points.

18. The non-transitory computer-readable storage medium of claim 17, wherein the method further comprises using the printing indicator computed for the set of evaluation points to determine a contour for the mask layout which represents pattern shapes which are expected to be printed on a wafer.

19. The non-transitory computer-readable storage medium of claim 11, wherein prior to receiving the evaluation point, the method further comprises:
identifying areas within the mask layout which are less likely to contain lithography hotspots; and
selecting sparse evaluation points in the identified areas.

20. The non-transitory computer-readable storage medium of claim 19, wherein the method further comprises:
identifying areas within the mask layout which are likely to contain lithography hotspots; and
selecting dense evaluation points in the identified areas.

21. A computer system that performs lithography verification for a double-patterning process on a mask layout without performing a full contour simulation of the mask layout, comprising:
a processor; and
a non-transitory computer-readable storage medium storing instructions, the instructions comprising:
instructions to receive a first mask which is used in a first lithography step of the double-patterning process, and a second mask which is used in a second lithography step of the double-patterning process, wherein the first mask and the second mask are obtained by partitioning the mask layout;

instructions to receive an evaluation point on the mask layout;

instructions to determine whether the evaluation point is exclusively located on a polygon of the first mask, exclusively located on a polygon of the second mask, or located elsewhere; and instructions to compute a printing indicator at the evaluation point for the mask layout based on whether the evaluation point is exclusively located on a polygon of the first mask or exclusively located on a polygon of the second mask.

22. The computer system of claim 21, wherein the instructions to compute the printing indicator include:

instructions to use a first lithography model associated with the first lithography step to compute the printing indicator at the evaluation point if the evaluation point is exclusively located on a polygon of the first mask;

instructions to use a second lithography model associated with the second lithography step to compute the printing indicator at the evaluation point if the evaluation point is exclusively located on a polygon of the second mask; and instructions to use both the first lithography model and the second lithography model to compute the printing indicator at the evaluation point if the evaluation point is neither exclusively located on a polygon of the first mask, nor exclusively located on a polygon of the second mask.

23. The computer system of claim 21, wherein the instructions stored on the non-transitory computer-readable storage medium include instructions to receive a set of evaluation points on the mask layout, wherein the set of evaluation points are used to sample an area within the mask layout which is likely to contain a lithography hotspot; and wherein the instructions stored on the non-transitory computer-readable storage medium include instructions to determine the printing indicator at the set of the evaluation points.

24. The computer system of claim 23, wherein the instructions stored on the non-transitory computer-readable storage medium include instructions to use the printing indicator computed for the set of evaluation points to determine a contour for the mask layout which represents pattern shapes which are expected to be printed on a wafer.

* * * * *